United States Patent
Kumar et al.

(10) Patent No.: US 9,287,875 B2
(45) Date of Patent: Mar. 15, 2016

(54) LOAD SWITCH FOR CONTROLLING ELECTRICAL COUPLING BETWEEN POWER SUPPLY AND LOAD

(71) Applicant: TEXAS INSTRUMENTS INCORPORATED, Dallas, TX (US)

(72) Inventors: Alok Kumar, Bangalore (IN); Fenish Padinjaroot Prakasan, Bangalore (IN); Rajkumar Jayaraman, Bangalore (IN); Kalyan Cherukuri, Allen, TX (US); Praveen Krishnamurthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 14/272,149

(22) Filed: May 7, 2014

(65) Prior Publication Data
US 2015/0326226 A1 Nov. 12, 2015

(51) Int. Cl.
*H03L 5/00* (2006.01)
*H03K 19/0185* (2006.01)

(52) U.S. Cl.
CPC ............................. *H03K 19/018571* (2013.01)

(58) Field of Classification Search
CPC ..................... H03K 3/1013; H03K 19/017509
USPC .................... 327/306, 333; 326/62–63, 80–81
See application file for complete search history.

(56) References Cited

U.S. PATENT DOCUMENTS

| | | | | |
|---|---|---|---|---|
| 5,073,837 A | * | 12/1991 | Baek | 361/92 |
| 5,574,358 A | * | 11/1996 | Garrett | 323/276 |
| 5,942,813 A | * | 8/1999 | Smith | 307/125 |
| 2012/0280751 A1 | * | 11/2012 | Deng | 330/260 |

* cited by examiner

*Primary Examiner* — Dinh Le
(74) *Attorney, Agent, or Firm* — Gregory J. Albin; Frank D. Cimino

(57) ABSTRACT

Circuits and methods for controlling electrical coupling by a load switch are disclosed. In an embodiment, the load switch includes a pass element, level-shift circuit and low-resistance active path. The pass element is configured to be coupled to a power supply and a load, and is configured to electrically couple the power supply with the load during ON-state and electrically decouple the power supply from the load during OFF-state. The level-shift circuit includes a first transistor and pull-up resistor and is configured to generate a level-shifted signal in response to an enable signal, and enable the ON-state and the OFF-state of the pass element based on first and second voltages of the level-shifted signal. The low-resistance active path is coupled in parallel with the pull-up resistor for shunting the pull-up resistor in the OFF-state by providing a path for a leakage current of the first transistor in the OFF-state.

20 Claims, 3 Drawing Sheets

LOAD SWITCH FOR CONTROLLING ELECTRICAL COUPLING BETWEEN POWER SUPPLY AND LOAD

TECHNICAL FIELD

The present disclosure generally relates to the field of controlling electrical coupling by load switches.

BACKGROUND

In accordance with an example scenario, load switches are extensively used in certain applications in order to reduce power consumption by electrically decoupling power to electronic subsystems that are not in use. The load switches are also employed to control load in-rush current that may arise when a logic enable is applied to switch the load switch to an "ON-state". Some examples of such applications include various mobile phones, laptops, personal music and multimedia players, portable game consoles, power supplies, servers, desktop computers, and the like. Pursuant to one example scenario, in order to achieve a power-efficient operation of a load switch (for example, either an integrated load switch or a discrete load switch), a load switch quiescent current is to be maintained at a minimum implemented level when the load switch is in the ON-state. Low quiescent current operation can be achieved by using processes that are relatively more expensive than standard CMOS processes, and by employing other circuit techniques for example, by using a high value pull-up resistance. However, such processes and circuit techniques compromise performance of the load-switch, for example, load switch's off-isolation performance, under the presence of the fast supply transients, high temperature, noise, and the like, at times when the load switch should actually be in the OFF-state pursuant to implemented system operation.

SUMMARY

This Summary is provided to introduce a selection of concepts in a simplified form that are further described below in the detailed description. This Summary is not intended to identify key or essential features of the claimed subject matter, nor is it intended to be used as an aid in determining the scope of the claimed subject matter.

Various circuits and methods for controlling electrical coupling by a load switch are disclosed. In an embodiment, a load switch includes a pass element, a level-shift circuit and a low-resistance active path. The pass element includes a first node, a second node and a third node. The pass element is configured to be coupled to a power supply and a load, and the pass element further configured to electrically couple the power supply with the load during an ON-state of the pass element and electrically decouple the power supply from the load during an OFF-state of the pass element. The first node is positioned to be coupled to the power supply and the second node is positioned to be coupled to the load. The level-shift circuit includes a first transistor and a pull-up resistor. The first transistor includes a first terminal, a second terminal and a third terminal. The pull-up resistor is coupled between the first node and the first terminal. The first transistor and the pull-up resistor are configured to generate a level-shifted signal at the first terminal in response to an enable signal at the third terminal, and configured to enable the ON-state and the OFF-state of the pass element based on a first voltage and a second voltage of the level-shifted signal, respectively. The low-resistance active path is coupled in parallel with the pull-up resistor for shunting the pull-up resistor in the OFF-state of the load switch by providing a path for a leakage current of the first transistor in the OFF-state.

In another embodiment, a load switch including a pass element, a level-shift circuit and a low-resistance active path is disclosed. The pass element includes a first node, a second node and a third node. The pass element is configured to be coupled to a power supply and a load, and the pass element further configured to electrically couple the power supply with the load during an ON-state of the pass element and electrically decouple the power supply from the load during an OFF-state of the pass element. The first node is positioned to be coupled to the power supply and the second node is positioned to be coupled to the load. The level-shift circuit includes a first transistor and a pull-up resistor. The first transistor includes a first terminal, a second terminal and a third terminal. The pull-up resistor is coupled between the first node and the first terminal. The first transistor and the pull-up resistor is configured to generate a level-shifted signal at the first terminal in response to an enable signal at the third terminal, and configured to enable the ON-state and the OFF-state of the pass element based on a first voltage and a second voltage of the level-shifted signal, respectively. The low-resistance active path is coupled in parallel with the pull-up resistor for shunting the pull-up resistor in the OFF-state by providing a path for a leakage current of the first transistor in the OFF-state. The low-resistance active path includes a second transistor and an inverter. The second transistor includes a drain terminal, a source terminal and a gate terminal, the drain terminal and the source terminal are coupled to the third node and the first node of the pass element, respectively. The inverter is coupled between the first terminal and the gate terminal such that the inverter is positioned to provide an inverted signal to the gate terminal. The second transistor is configured to be switched to an ON-state in the OFF-state of the pass element in response to the inverted signal to thereby preclude an erroneous switching of the pass element into the ON-state when the pass element is in the OFF-state.

In another embodiment, a method of controlling electrical coupling by a load switch is disclosed. In an embodiment, the method includes implementing a pass element that is configured to be coupled to a power supply and a load, and the pass element further configured to electrically couple the power supply with the load during an ON-state of the pass element and electrically decouple the power supply from the load during an OFF-state of the pass element. The pass element includes a first node, a second node and a third node. The first node is positioned to be coupled to the power supply and the second node is positioned to be coupled to the load. Additionally, the method includes controlling the ON-state and the OFF-state of the pass element by generating a level-shifted signal with a level-shift circuit in response to an enable signal, and enabling the ON-state and the OFF-state of the pass element based on a first voltage and a second voltage of the level-shifted signal. The level-shift circuit includes a first transistor and a pull-up resistor. The first transistor includes a first terminal, a second terminal and a third terminal. The pull-up resistor is coupled between the first node and the first terminal. The method also includes providing a low-resistance active path for shunting the pull-up resistor in the OFF-state by providing a path for a leakage current of the first transistor in the OFF-state.

Other aspects and example embodiments are provided in the drawings and the detailed description that follows.

The drawings referred to in this description are not to be understood as being drawn to scale except if specifically noted, and such drawings are only for example purposes in nature.

DETAILED DESCRIPTION

Electronic devices have a need to extend battery life while meeting an ever increasing demand for higher performance and power efficiency. Additionally, a load-inrush current needs to be limited while turning-ON the load. Load switches provide a simple and inexpensive method for an electronic device to extend the battery life based on selectively switching ON/OFF of peripherals or sub-circuits of the electronic device based on usage requirements, while providing an inexpensive way of controlling the inrush current. The load switches are generally present in notebooks, cell phones, hand held gaming systems and many other electronic devices. A load switch electrically couples or electrically decouples a power supply to a specific load However, maintaining an off isolation of the load switch is important to preclude the load switch from getting erroneously switched ON during a time when the load switch is supposed to electrically decouple the power supply to the load. Such erroneous switching of the load switch can be caused by a leakage current and/or fast supply transients thereby degrading the battery life and system performance. Herein, the term 'off isolation' can refer to a measure of an OFF-state performance of the load switch. Further, during the ON-state of the load switch, it is required that a quiescent current (IQ) of an electronic device be kept to a minimum. Herein, the term 'quiescent current' refers to a current drawn by the electronic device when the electronic device is in operating state. However, while ensuring a low IQ during the ON-state of the load switch it is also required that the load switch be operated efficiently to prevent any unwanted switching of the load switch to the ON-state during the OFF-state of the load switch. An example load switch (that is not in accordance with example embodiments of the present invention) is explained with reference to FIG. 1.

Figure 1:
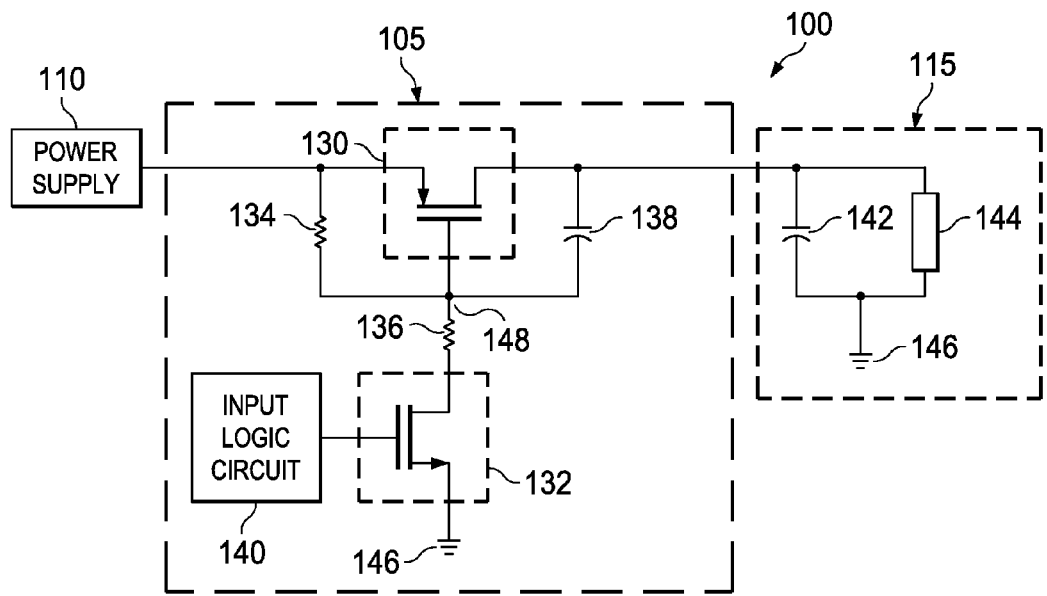
FIG. 1 is a circuit diagram of a circuit representing a first example load switch in accordance with an example scenario.

FIG. 1 is a circuit diagram of a circuit representing a first example load switch, in accordance with an example scenario. In this example representation, a circuit 100 is shown that includes a load switch 105. The load switch 105 is a high-side load switch that electrically couples and electrically decouples a power supply 110, for example a battery or an adaptor, to a load 115. The load switch 105 includes a pass element 130, a transistor 132, and a pull-up resistor 134. The load switch 105 further includes a resistor 136, a capacitor 138 (also referred to as a slew rate setting capacitor 138), and an input logic circuit 140. The resistor 136 and the capacitor 138 are optional elements. The load 115 includes a load capacitor 142 and a load element 144. In this example scenario, the pass element 130 is a p-type metal oxide semiconductor (PMOS) transistor having a source terminal, a drain terminal and a gate terminal. In one example, the transistor 132 is an n-type metal oxide semiconductor (NMOS) transistor having a drain terminal, a source terminal and a gate terminal. The source terminal of the pass element 130 is coupled to the power supply 110 and the drain terminal of the pass element 130 is coupled to the load 115. The gate terminal of the pass element 130 is coupled to a first terminal of the resistor 136. A second terminal of the resistor 136 is coupled to the drain terminal of the transistor 132. The source terminal of the transistor 132 is coupled to ground 146 and the gate terminal of the transistor 132 is coupled to the input logic circuit 140. The pull-up resistor 134 is coupled between the source terminal of the pass element 130 and the gate terminal of the pass element 130. The capacitor 138 is coupled between the drain terminal of the pass element 130 and the gate terminal of the pass element 130. In some forms, the capacitor 138 is a parasitic capacitor. The load capacitor 142 and the load element 144 are both coupled between the drain terminal of the pass element 130 and the ground 146.

A power supply voltage (VDD) is generated by the power supply 110 and the pass element 130 in the load switch 105 is used to electrically couple and electrically decouple the power supply 110 to the load 115. The pass element 130 electrically couples the power supply 110 to the load 115 in an ON-state of the pass element 130 and passes a current from the power supply 110 to the load 115. The pass element 130 further electrically decouples the power supply 110 to the load 115 in an OFF-state of the pass element 130. In an example, the pass element 130 is a low ON resistance (RDS_ON) power field effect transistor (FET). The pass element 130 is controlled by the transistor 132 and the pull-up resistor 134. The pass element 130 and the pull-up resistor 134 form an open drain inverting level-shifter.

When the gate terminal of the transistor 132 receives an enable signal at a logic HIGH from the input logic circuit 140, the transistor 132 is switched to the ON-state and the pull-up resistor 134 and the capacitor 138 are pulled down (to logic LOW) to the ground 146, in turn switching the pass element 130 to the ON-state. The pass element 130 then passes the current from the power supply 110 to the load 115. A turn-on time constant associated with the pass element 130 is controlled by at least one of the resistor 136 and the capacitor 138. For the turn-on time constant to be dependent only on the resistor 136, the transistor 132 is required to have a low RDS_ON.

When the gate terminal of the transistor 132 receives the enable signal at a logic LOW from the input logic circuit 140, the transistor 132 is switched to the OFF-state and the pull-up resistor 134 and the capacitor 138 are pulled up to VDD (for example, logic HIGH), in turn switching the pass element 130 to the OFF-state. The pass element 130 then does not pass the current from the power supply 110 to the load 115. A turn-off time constant associated with the pass element 130 is primarily controlled by the pull-up resistor 134 and the capacitor 138. For the IQ to be constant and dependent only on the resistor 136, the transistor 132 is required to have the low RDS_ON. However, when the transistor 132 is switched to the OFF-state for the logic LOW equivalent to 0 volts (V), a leakage current (drain-source leakage current) of the transistor 132 flows through the pull-up resistor 134 thereby developing a voltage drop (VSG) across the source terminal and the gate terminal of the pass element 130. In an example, at room temperature, the leakage current is low, for example 100 nano Amperes (nA), thereby resulting in a low voltage drop, for example 100 milli volts (mV) across the pull-up resistor 134 of 1 mega ohms (Me). The pass element 130 hence erroneously operates in a sub-threshold region even when the pass element 130 is required to remain in the OFF-state.

Additionally, if there is an increase in temperature, the leakage current of the transistor 132 increases with temperature and thereby resulting in a higher voltage drop (VSG) across the gate terminal and the source terminal of the pass element 130, for example even higher than 1V. The pass element 130 is hence erroneously switched to the ON-state (for example, active state) when the pass element 130 is required to remain in the OFF-state. In practice, the logic LOW is equivalent to a voltage upto a voltage output low ($V_{OL}$), for example 0.4V, of the input logic circuit 140. $V_{OL}$ is a voltage parameter associated with a noise margin of the input logic circuit 140. Herein, the term 'noise margin' refers to amount of noise that the input logic circuit 140 can withstand for an efficient operation of the input logic circuit 140. When the logic LOW is not 0V the leakage current increases further and the pass element 130 can switch to the ON-state even at the room temperature, effectively reducing a noise margin of the load switch 105.

In one instance, output of the power supply 110 experiences a fast transient step, for example a 0V to 5V (VDD) step, with a fast rise time when the enable signal is at the logic LOW. Due to the fast transient step, the turn-off time constant (also referred to as a pull-up time constant) which is controlled by the pull-up resistor 134 and the capacitor 138 introduces a time lag between VDD and a node 148 that is a junction node of the pull-up resistor 134 and the capacitor 138. The time lag is caused as the capacitor 138 charges from 0V to VDD at a low speed determined by the pull-up resistor 134 and the capacitor 138. As voltage at the gate terminal of the pass element 130 reflects VDD, during the fast transient step at 0V the pass element 130 switches to the ON-state when the pass element 130 is required to remain in the OFF-state. Also, due to the time lag the pass element 130 remains in the ON-state until the capacitor charges up to VDD, the output of the power supply 110. In one example, with the pull-up resistor 134 having a resistance of 1 MΩ and the capacitor 138 having a capacitance of 100 nano farad (nF), the pass element 130 remains in the ON-state with the turn-off time constant of 100 milli seconds (100 ms). Hence, the leakage current and fast supply transients degrade the off isolation of the pass element 130.

Various embodiments of the present technology provide solutions that are capable of controlling electrical coupling by load switches and that are capable of providing improved power efficiency under noisy conditions in the load switches, and these solutions overcome the above described and other limitations, in addition to providing currently unavailable benefits. Various embodiments of the present technology are herein disclosed in conjunction with FIGS. 2-4.

Figure 2:
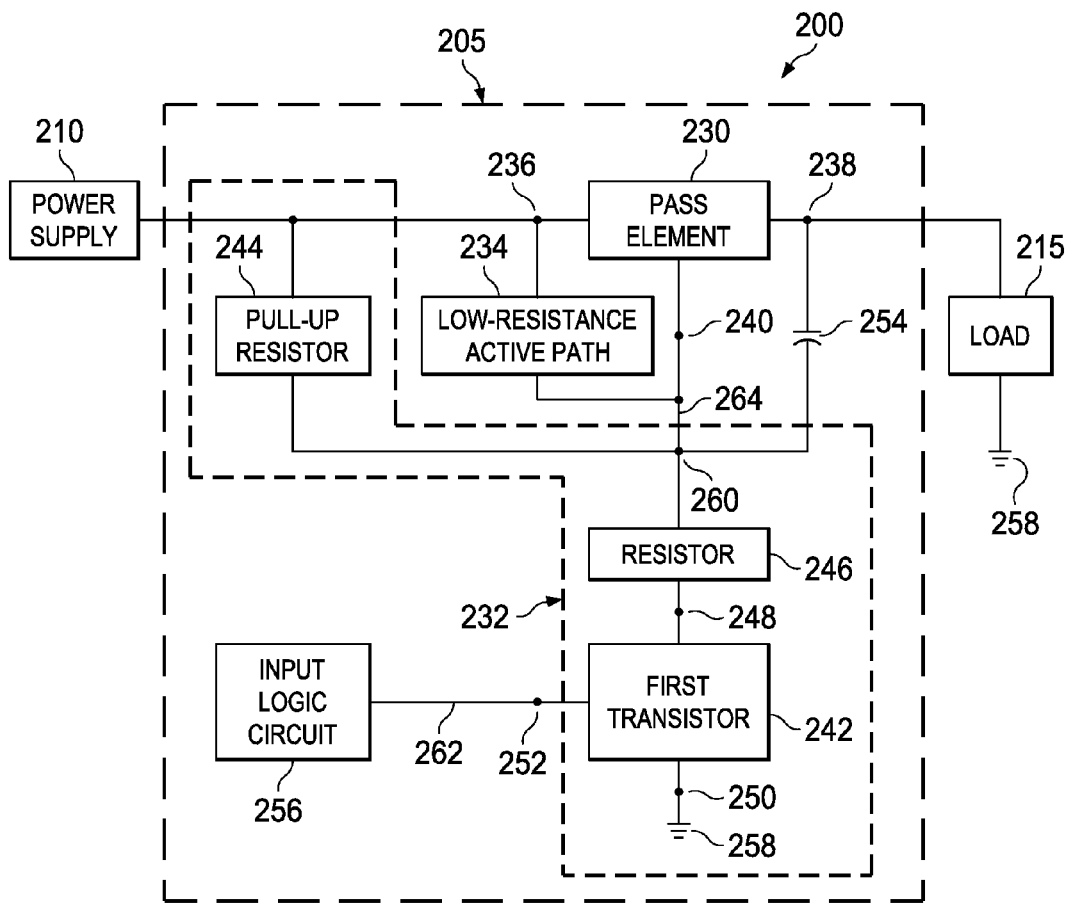
FIG. 2 is a block diagram of a circuit representing a second example load switch in accordance with an embodiment.

Referring to FIG. 2, a block diagram of a circuit representing a second example load switch is illustrated, in accordance with an example embodiment. In this example representation, a circuit 200 is shown that includes a load switch 205. The load switch 205 provides improved off isolation and improved power efficiency as compared to the load switch 105 shown in FIG. 1. As shown in the circuit 200, the load switch 205 is a high-side load switch that electrically couples and electrically decouples a power supply 210 and a load 215. The load switch 205 includes a pass element 230, a level-shift circuit 232, and a low-resistance active path 234. Hereinafter, the low-resistance active path 234 is also referred to as the path 234.

The pass element 230 is configured to be coupled to the power supply 210 and the load 215, and includes a first node 236, a second node 238 and a third node 240. The first node 236 is positioned to be coupled to the power supply 210, and the second node 238 is positioned to be coupled to the load 215. In one example, the pass element 230 is a p-type metal oxide semiconductor (PMOS) transistor, however it should not be considered limiting to the scope of the present technology. The level-shift circuit 232 includes a first transistor 242, a pull-up resistor 244, and a resistor 246. The first transistor 242 includes a first terminal 248, a second terminal 250 and a third terminal 252. In one example, the first transistor 242 is an n-type metal oxide semiconductor (NMOS) transistor, however it should not be considered limiting to the scope of the present technology. The pull-up resistor 244 is coupled between the first node 236 and a node 260. In this embodiment, the resistor 246 is coupled between the node 260 and the first terminal 248. However, in another embodiment, the resistor 246 is coupled between the source terminal 250 and the ground 258. Further, in an additional embodiment, the resistor 246 is not included in the load switch 105. The second terminal 250 is further coupled to ground 258. The path 234 is coupled in parallel with the pull-up resistor 244 and has one terminal coupled to the first node 236, and another terminal coupled to the node 260. In an embodiment, a capacitor 254 is coupled between the second node 238 and the node 260. In another embodiment, an input logic circuit 256 is coupled to the third terminal 252.

A power supply voltage (VDD) is generated by the power supply 210 and is fed to the first node 236 of the pass element 230. The pass element 230 is configured to electrically couple the power supply 210 (for example a battery or an adaptor) with the load 215 during an ON-state of the pass element 230 and electrically decouple the power supply 210 from the load 215 during an OFF-state of the pass element 230. The input logic circuit 256 generates an enable signal 262 that is either at a logic LOW or a logic HIGH, and provides the enable signal 262 at the third terminal 252. The level-shift circuit 232 is configured to generate a level-shifted signal 264 at the node 260 in response to the enable signal 262, and is configured to enable the ON-state and the OFF-state of the pass element 230 based on a first voltage and a second voltage of the level-shifted signal 264. Herein, the term level-shifted signal 264' refers to level-shifting a signal from one level to another, for example from a logic LOW to a logic HIGH or from a logic HIGH to a logic LOW. Herein, the term 'first voltage of the level-shifted signal 264' refers to a voltage above a threshold voltage that enables the ON-state of the pass element 230. Herein, the term 'second voltage of the level-shifted signal 264' refers to a voltage below the threshold voltage that enables the OFF-state of the pass element 230. The capacitor 254 is configured to control a slew rate of the pass element 230. Herein, the term 'slew rate' refers to a turn-ON time constant of the pass element 230. The path 234 is configured to shunt the pull-up resistor 244 in the OFF-state of the pass element 230 by providing a path for a leakage current (generated by the first transistor 242 in the level-shift circuit 232 during the OFF-state of the pass element 230) and to apply a low resistance and a high resistance during the OFF-state and the ON-state of the pass element 230, respectively. It should be noted that the path 234 may be configured by any combination of suitable active and passive electronic elements, such that the low resistance (offered during the OFF-state of the pass element 230) is lower than a resistance of the pull-up resistor 244, and the high resistance (offered during the ON-state of the pass element 230) is higher than the resistance of the pull-up resistor 244. The path 234 is further configured to control a turn-off time constant of the pass element 230. The path 234 hence improves off isolation of the load switch 205.

Some example embodiments of a load switch (for example, the load switch 205) are also explained with reference to FIG. 3.

Figure 3:
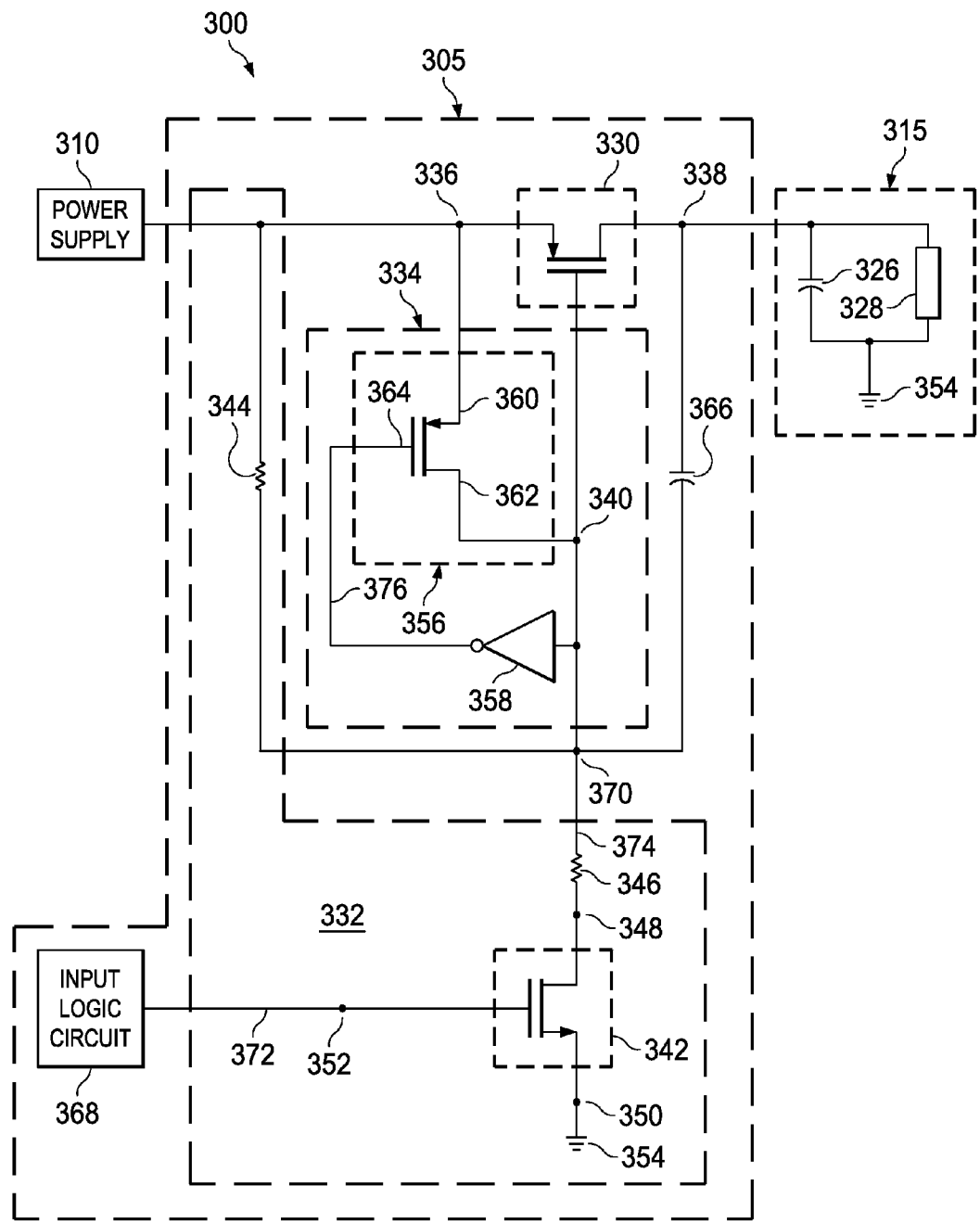
FIG. 3 is a circuit diagram of a circuit representing a third example load switch in accordance with an embodiment.

Referring to FIG. 3, a circuit diagram of a circuit representing a third example load switch is shown, in accordance with an example embodiment. In this example representation, a circuit 300 is shown that includes a load switch 305. The load switch 305 provides improved off isolation and improved power efficiency as compared to the load switch 105 shown in FIG. 1. As shown in the circuit 300, the load switch 305 is a high-side load switch that electrically couples and electrically decouples a power supply 310 and a load 315. The load 315 includes a load capacitor 326 and a load element 328. The load switch 305 includes a pass element 330, a level-shift circuit 332, and a low-resistance active path 334. Hereinafter, the low-resistance active path 334 is also referred to as the path 334.

The pass element 330 is configured to be coupled to the power supply 310 and the load 315, and includes a first node 336, a second node 338 and a third node 340. The first node 336 is positioned to be coupled to the power supply 310, and the second node 338 is positioned to be coupled to the load 315. In an embodiment, the first node 336 is a source terminal of the pass element 330, the second node 338 is a drain terminal of the pass element 330, and the third node 340 is a gate terminal of the pass element 330. In one example, the pass element 330 is a PMOS transistor, however it should not be considered limiting to the scope of the present technology.

The level-shift circuit 332 includes a first transistor 342, a pull-up resistor 344, and a resistor 346. The first transistor 342 includes a first terminal 348, a second terminal 350 and a third terminal 352. The third node 340 of the pass element 330 is coupled to a node 370. In an embodiment, the first terminal 348 is a drain terminal of the first transistor 342, the second terminal 350 is a source terminal of the first transistor 342, and the third terminal 352 is a gate terminal of the first transistor 342. In one example, the first transistor 342 is an NMOS transistor, however it should not be considered limiting to the scope of the present technology. The pull-up resistor 344 is coupled between the first node 336 and the node 370. The resistor 346 is coupled between the node 370 and the first terminal 348. The second terminal 350 is coupled to ground 354. In another embodiment, the resistor 346 is coupled between the second terminal 350 and the ground 354. Further, in an additional embodiment, the resistor 346 is not present in the load switch 305.

The path 334 is coupled in parallel with the pull-up resistor 244. In the embodiment shown in FIG. 3, the path 334 includes a second transistor 356 and an inverter 358, however it should not be considered as limiting. For example, the path 334 may be configured by any combination of suitable active and passive electronic elements. The second transistor 356 includes a source terminal 360, a drain terminal 362 and a gate terminal 364, the source terminal 360 and the drain terminal 362 coupled to the first node 336 and the third node 340 of the pass element 330, respectively. In one example, the second transistor 356 is a PMOS transistor, however it should not be considered limiting to the scope of the present technology. The inverter 358 is coupled between the node 370 and the gate terminal 364. In an embodiment, a capacitor 366 is coupled between the second node 338 and the node 370. In another embodiment, an input logic circuit 368 is coupled to the third terminal 352. In an embodiment, the load capacitor 326 and the load element 328 are both coupled between the second node 338 of the pass element 330 and the ground 354.

The pass element 330 is configured to electrically couple the power supply 310 with the load 315 (the load capacitor 326 and the load element 328) during the ON-state of the pass element 330 and electrically decouple the power supply 310 from the load 315 during the OFF-state of the pass element 330. During the ON-state of the pass element 330, the pass element 330 passes a current (for example, a load current) to the load 315. The input logic circuit 368 generates an enable signal 372 that is either at the logic LOW or the logic HIGH. The first transistor 342 is either switched to an ON-state or an OFF-state based on receiving the enable signal 372 at the third terminal 352 (from the input logic circuit 368). The first transistor 342 together with the pull-up resistor 344 is configured to generate a level-shifted signal 374 at the first terminal 348 in response to the enable signal 372.

The first transistor 342 of the level-shift circuit 332 is further configured to enable the ON-state and the OFF-state of the pass element 330 based on the first voltage and the second voltage of the level-shifted signal 374, respectively. For instance, when the level-shifted signal 374 is at the first voltage due to a high voltage of the enable signal 372, the first voltage causes the pass element 330 to switch to the ON-state. Similarly, when the level-shifted signal 374 is at the second voltage due to a low voltage of the enable signal 372, the second voltage causes the pass element 330 to switch to the OFF-state. It should be noted that the capacitor 366 is configured to control the slew rate of the pass element 330. During the OFF-state of the pass element 330, the path 334 enables the pass element 330 to be maintained in the OFF-state and thereby precludes an erroneous switching of the pass element 330 into the ON-state when the pass element 330 is in the OFF-state. The inverter 358 is configured to receive the level-shifted signal 374 at the node 370 and generate an inverted signal 376 at an output of the inverter 358. The inverted signal 376 is provided to the gate terminal 364 of the second transistor 356. The second transistor 356 is configured to be switched to an ON-state or an OFF-state in response to the inverted signal 376 received at the gate terminal 364. During the ON-state of the pass element 330, the pull-up resistor 344 has a resistance lower than a high resistance of the second transistor 356 and enables generation of the level-shifted signal 374. During the OFF-state of the pass element 330, the path 334 is activated and the second transistor 356 provides a path for a leakage current of the first transistor 342 as a low resistance of the second transistor 356 is lower than the resistance of the pull-up resistor 344.

An example embodiment of the ON-state of the pass element 330 and thereby electrical coupling of the power supply 310 to the load 315 can be explained as follows. For instance, in a first operating scenario, the enable signal 372 generated by the input logic circuit 368 is at the logic HIGH. In this example, the logic HIGH at the third terminal 352 causes the first transistor 342 (the NMOS transistor) to be switched to an ON-state. Due to the ON-state of the first transistor 342, the third node 340 is pulled down to the ground 354, thereby pulling the pull-up resistor 344 and the capacitor 366 also to the ground 354. The level-shifted signal 374 is now at a logic LOW based on level-shifting the enable signal 372 from the logic HIGH. A voltage drop occurs across the first node 336 and the third node 340 and a source to gate voltage (VSG) of the pass element 330 increases above a threshold voltage associated with the pass element 330. The pass element 330 is hence switched to the ON-state. The pass element 330 then electrically couples the power supply 310 to the load 315 and passes the current. A turn-on time constant of the pass element 130 is controlled by at least one of the resistor 346 and the capacitor 366. In some embodiments, if a turn-on speed of the load switch 305 is high, load-inrush current occurs that degrades operation of the load switch 305. Herein, the term 'load-inrush current' refers to a transient current spike that occurs on VDD when the load switch 305 is turned ON and electrically coupled to the load 315 (a capacitive load). The resistor 346 and the capacitor 366 are used to control the turn-on speed of the load switch 305 and thereby control the inrush current.

An example embodiment of the OFF-state of the pass element 330 and thereby coupling of the power supply 310 to the load 315 and precluding any erroneous switching to the ON-state during the intended OFF-state can be explained as follows. For instance, in a second operating scenario, the enable signal 372 generated by the input logic circuit 368 is at the logic LOW. In this example, the logic LOW at the third terminal 352 causes the first transistor 342 (the NMOS transistor) to be switched to an OFF-state. Due to the OFF-state of the first transistor 342, the third node 340 is pulled up to VDD, thereby pulling the pull-up resistor 344 and the capacitor 366 also to VDD. The level-shifted signal 374 is now at a logic HIGH based on level-shifting the enable signal 372 from the logic LOW. Due to the high logic at the third node 340, the pass element 330 is switched to the OFF-state. The pass element 330 then electrically decouples the power supply 310 to the load 315.

In order to maintain the off isolation of the pass element 330 in the OFF-state, the path 334 provides a path for the leakage current of the first transistor 342 that is generated during the OFF-state of the pass element 330. The inverter 358 inverts the level-shifted signal 374 (at the logic HIGH) to generate the inverted signal 376 at a logic LOW. The second transistor 356 is hence switched to the ON-state. As the low resistance of the second transistor 356 is lower than resistance of the pull-up resistor 344, the second transistor 356 shunts the pull-up resistor 344 and enables the leakage current to flow through the second transistor 356. As the leakage current flows through a different path (through the second transistor 356, there is no VSG across the pass element 330. Even if some VSG of the pass element 330 is found to be present, the VSG is determined to be negligible (around few micro volts ($\mu V$)) even at high temperatures and at the $V_{OL}$ of the input logic circuit 368. As the VSG is negligible, the pass element 330 is not switched to the ON-state. Hence, usage of the path 334 in the load switch 305 when the load switch 305 is not enabled by the input logic circuit 368 precludes the erroneous switching of the pass element 330 into the ON-state when the pass element 330 is intended to be maintained in the OFF-state. Further, during the OFF-state of the pass element 330, the turn-off time constant of the pass element 330 is controlled by the second transistor 356 due to the low resistance of the second transistor 356, and thereby the pass element 330 is not switched to the ON-state even when the load switch 305 is subjected to fast supply transients.

Figure 4:
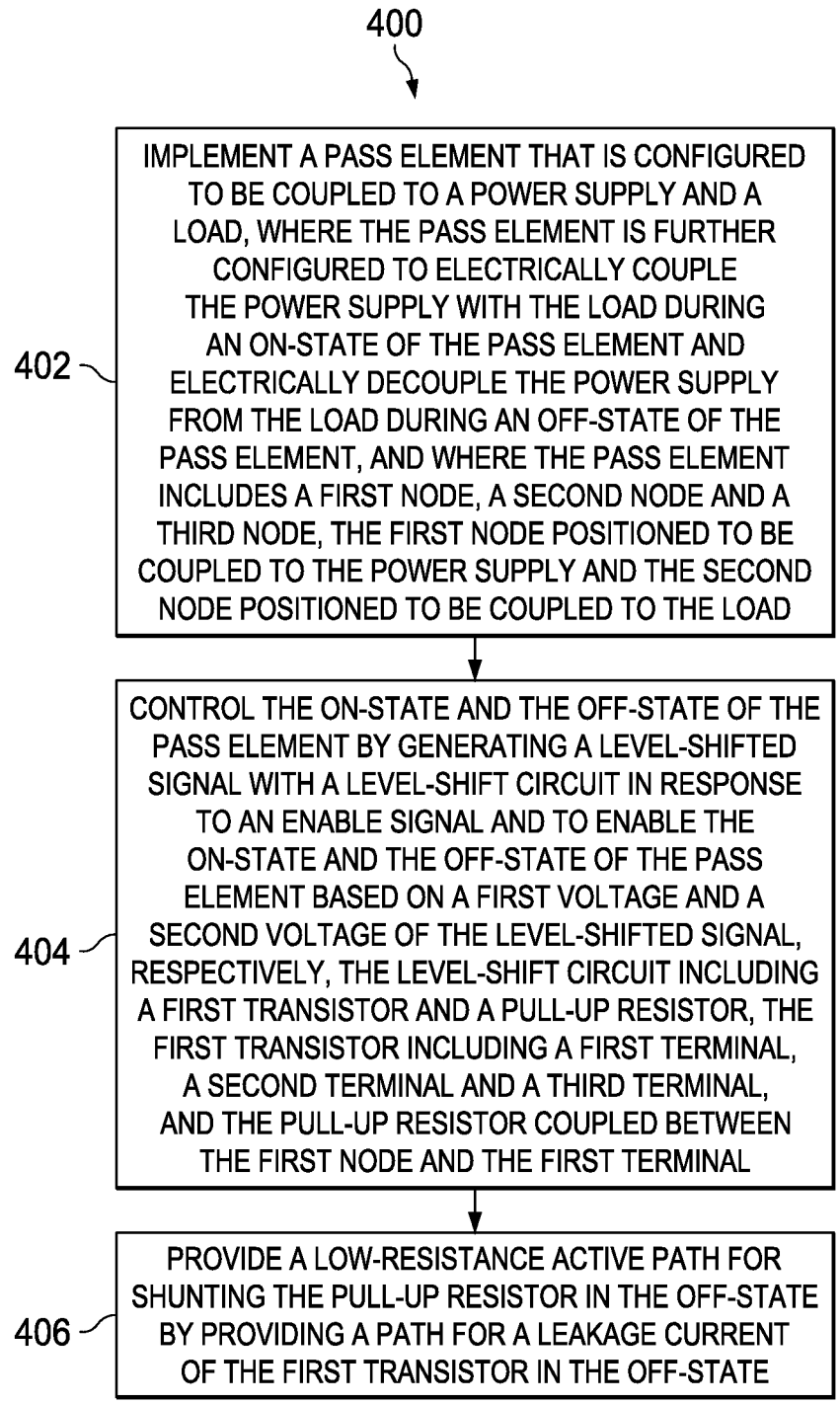
FIG. 4 illustrates a flowchart of an example method of controlling electrical coupling by a load switch in accordance with an embodiment.

FIG. 4 illustrates a flowchart of an example method 400 of controlling electrical coupling by a load switch, for example the load switches 205 or 305, as explained with reference to FIG. 2 and FIG. 3, respectively.

The load switch is used for electrically coupling and electrically decoupling power to electronic sub-systems or sub-circuits of an electronic device as and when required in order to increase power efficiency of the electronic device. Examples of the electronic device include, but are not limited to, a mobile phone, a laptop, a digital camera, a tablet, a portable gaming device.

At block 402, a pass element (for example the pass elements 230 or 330) that is configured to be coupled to a power supply (for example, the power supply 310) and a load (for example, the load 315) is implemented. The pass element is further configured to electrically couple the power supply with the load during an ON-state of the pass element and configured to electrically decouple the power supply from the load during an OFF-state of the pass element. The pass element includes a first node (for example, the first node 336), a second node (for example, the second node 338) and a third node (for example, the third node 340). The first node is positioned to be coupled to the power supply and the second node is positioned to be coupled to the load.

At block 404, the ON-state and the OFF-state of the pass element is controlled based on generating a level-shifted signal (for example, the level-shifted signals 264 or 374) with a level-shift circuit (for example, the level-shift circuits 232 or 332) in response to an enable signal (for example, the enable signals 262 or 372) and the ON-state and the OFF-state of the pass element is enabled based on a first voltage and a second voltage of the level-shifted signal, respectively. The first voltage of the level-shifted signal is above a threshold voltage to enable the ON-state of the pass element, and the second voltage of the level-shifted signal is below the threshold voltage to enable the OFF-state of the pass element. The level-shift circuit includes a first transistor (for example, the first transistor 342) and a pull-up resistor (for example, the pull-up resistor 344). The first transistor includes a first terminal (for example, the first terminal 348), a second terminal (for example, the second terminal 350) and a third terminal (for example, the third terminal 352). The pull-up resistor is coupled between the first node and a node (for example, the node 370).

At block 406, a low-resistance active path (for example, the paths 234 or 334) is provided for shunting the pull-up resistor in the OFF-state by providing a path for a leakage current of the first transistor in the OFF-state. The low-resistance active path is configured to apply a low resistance and a high resistance during the OFF-state and the ON-state of the pass element, respectively. The low resistance is lower than a resistance of the pull-up resistor, and the high resistance is higher than the resistance of the pull-up resistor. The low-resistance active path is coupled in parallel with the pull-up resistor.

The low-resistance active path is implemented by inverting the level-shifted signal at the node with an inverter of the low-resistance active path to generate an inverted signal (for example, the inverted signal 376), and enabling a second transistor of the low-resistance active path to be switched to an ON-state in the OFF-state of the pass element in response to the inverted signal to thereby preclude an erroneous switching of the pass element into the ON-state when the pass element is in the OFF-state.

In some embodiments, a turn-on time constant of the pass element is controlled during the ON-state of the pass element, and a turn-off time constant of the pass element is controlled based on implementing the low-resistance active path during the OFF-state of the pass element.

Without in any way limiting the scope, interpretation, or application of the claims appearing below, advantages of one or more of the example embodiments disclosed herein include controlling electrical coupling by a load switch by introducing a low-resistance active path in the load switch. The low-resistance active path provides a path for a leakage current of a first transistor in a level-shift circuit of the load switch (during an OFF-state of the pass element) such that an erroneous switching of the pass element into the ON-state when the pass element is in the OFF-state is avoided (across a range of temperatures and also for practical logic low levels of an enable signal). The low-resistance active path further prevents the erroneous switching of the pass element into the ON-state even for fast supply transients on an input voltage as a turn-off time constant is controlled by the low-resistance active path (as low resistance of the low-resistance active path is lower than a resistance of a pull-up resistor during an OFF-state of the pass element). Hence, the load switch disclosed in the present disclosure achieves lower cost as standard complementary metal oxide semiconductor (CMOS) processes are used, and improves reliability as hysteresis is inherently added in the circuit even under noisy conditions.

Further, a low quiescent current is achieved thereby extending battery life of the electronic device that uses the load switch.

Although the present technology has been described with reference to specific example embodiments, it is noted that various modifications and changes can be made to these embodiments without departing from the broad spirit and scope of the present technology. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Also, techniques, devices, subsystems and methods described and illustrated in the various embodiments as discrete or separate can be combined or integrated with other systems, modules, techniques, or methods without departing from the scope of the present technology. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present technology.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present technology. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the technology has been described based upon these example embodiments, it is noted that certain modifications, variations, and alternative constructions can be apparent and well within the spirit and scope of the technology. Although various example embodiments of the present technology are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. A load switch comprising:
   a pass element comprising a first node and a second node, the pass element configured to be coupled to a power supply and a load, and the pass element further configured to electrically couple the power supply with the load during an ON-state of the pass element and electrically decouple the power supply from the load during an OFF-state of the pass element, the first node positioned to be coupled to the power supply and the second node positioned to be coupled to the load;
   a level-shift circuit comprising a first transistor and a pull-up resistor, the first transistor comprising a first terminal, a second terminal and a third terminal, the pull-up resistor coupled between the first node and the first terminal, the first transistor and the pull-up resistor configured to generate a level-shifted signal at the first terminal in response to an enable signal at the third terminal, and to enable the ON-state and the OFF-state of the pass element based on the level-shifted signal; and
   a low-resistance active path coupled in parallel with the pull-up resistor for shunting the pull-up resistor in the OFF-state by providing a path for a leakage current of the first transistor in the OFF-state.

2. The load switch of claim 1, wherein the level-shift circuit further comprises:
   a resistor coupled to the first transistor at the first terminal, the resistor configured to control a turn-on time constant of the pass element.

3. The load switch of claim 2, wherein the low-resistance active path is configured to apply a low resistance and a high resistance during the OFF-state and the ON-state of the pass element, respectively, the low resistance being lower than a resistance of the pull-up resistor, and the high resistance being higher than the resistance of the pull-up resistor.

4. The load switch of claim 3, wherein the low-resistance active path comprises:
   a second transistor comprising a drain terminal, a source terminal and a gate terminal, the drain terminal and the source terminal coupled to a third node and the first node of the pass element, respectively; and
   an inverter coupled between the first terminal and the gate terminal such that the inverter is positioned to provide an inverted signal to the gate terminal,
   wherein the second transistor is configured to be switched to an ON-state in the OFF-state of the pass element in response to the inverted signal to thereby preclude an erroneous switching of the pass element into the ON-state when the pass element is in the OFF-state.

5. The load switch of claim 4, further comprising:
   a capacitor coupled between the second node and the first terminal, the capacitor configured to control a slew rate of the pass element.

6. The load switch of claim 5, wherein the low-resistance active path is configured to control a turn-off time constant of the pass element.

7. The load switch of claim 6, wherein the first transistor and the pull-up resistor are further configured to enable the ON-state of the pass element when a voltage of the level-shifted signal is above a threshold voltage, and to enable the OFF-state of the pass element when the voltage of the level-shifted signal is below the threshold voltage.

8. The load switch of claim 7, wherein each of the pass element and the second transistor comprises a p-type metal oxide semiconductor (PMOS) transistor, and wherein the first transistor comprises an n-type metal oxide semiconductor (NMOS) transistor.

9. A load switch comprising:
   a pass element comprising a first node, a second node and a third node, the pass element configured to be coupled to a power supply and a load, and the pass element further configured to electrically couple the power supply with the load during an ON-state of the pass element and electrically decouple the power supply from the load during an OFF-state of the pass element, the first node positioned to be coupled to the power supply and the second node positioned to be coupled to the load;

a level-shift circuit comprising a first transistor and a pull-up resistor, the first transistor comprising a first terminal, a second terminal and a third terminal, the pull-up resistor coupled between the first node and the first terminal, the first transistor and the pull-up resistor configured to generate a level-shifted signal at the first terminal in response to an enable signal at the third terminal, and to enable the ON-state and the OFF-state of the pass element based on the level-shifted signal; and a low-resistance active path coupled in parallel with the pull-up resistor for shunting the pull-up resistor in the OFF-state by providing a path for a leakage current of the first transistor in the OFF-state, the low-resistance active path comprising:

a second transistor comprising a drain terminal, a source terminal and a gate terminal, the drain terminal and the source terminal coupled to the third node and the first node of the pass element, respectively; and an inverter coupled between the first terminal and the gate terminal such that the inverter is positioned to provide an inverted signal to the gate terminal, wherein the second transistor is configured to be switched to an ON-state in the OFF-state of the pass element in response to the inverted signal to thereby preclude an erroneous switching of the pass element into the ON-state when the pass element is in the OFF-state.

10. The load switch of claim 9, wherein the low-resistance active path is configured to apply a low resistance and a high resistance during the OFF-state and the ON-state of the pass element, respectively, the low resistance being lower than a resistance of the pull-up resistor, and the high resistance being higher than the resistance of the pull-up resistor.

11. The load switch of claim 10, wherein the level-shift circuit further comprises:

a resistor coupled to the first transistor at the first terminal, the resistor configured to control a turn-on time constant of the pass element.

12. The load switch of claim 11, further comprising:

a capacitor coupled between the second node and the third node, the capacitor configured to control a slew rate of the pass element.

13. The load switch of claim 12, further comprising:

an input logic circuit coupled to the third terminal, the input logic circuit configured to generate the enable signal to trigger the first transistor.

14. The load switch of claim 13, wherein the low-resistance active path is configured to control a turn-off time constant of the pass element.

15. The load switch of claim 14, wherein the first transistor and the pull-up resistor are further configured to enable the ON-state of the pass element when a voltage of the level-shifted signal is above a threshold voltage, and to enable the OFF-state of the pass element when the voltage of the level-shifted signal is below the threshold voltage.

16. The load switch of claim 15, wherein each of the pass element and the second transistor comprises a p-type metal oxide semiconductor (PMOS) transistor, and wherein the first transistor comprises an n-type metal oxide semiconductor (NMOS) transistor.

17. A method of controlling electrical coupling by a load switch, the method comprising:

implementing a pass element configured to be coupled to a power supply and a load, the pass element further configured to electrically couple the power supply with the load during an ON-state of the pass element and electrically decouple the power supply from the load during an OFF-state of the pass element, the pass element comprising a first node and a second node, the first node positioned to be coupled to the power supply and the second node positioned to be coupled to the load;

controlling the ON-state and the OFF-state of the pass element by generating a level-shifted signal with a level-shift circuit in response to an enable signal and enabling the ON-state and the OFF-state of the pass element based on the level-shifted signal, the level-shift circuit comprising a first transistor and a pull-up resistor, the first transistor comprising a first terminal, a second terminal and a third terminal, and the pull-up resistor coupled between the first node and the first terminal; and providing a low-resistance active path for shunting the pull-up resistor in the OFF-state by providing a path for a leakage current of the first transistor in the OFF-state.

18. The method of claim 17, wherein the low-resistance active path is configured to apply a low resistance and a high resistance during the OFF-state and the ON-state of the pass element, respectively, the low resistance being lower than a resistance of the pull-up resistor, the high resistance being higher than the resistance of the pull-up resistor, the low-resistance active path being coupled in parallel with the pull-up resistor and wherein providing the low-resistance active path comprises:

inverting the level-shifted signal at the first terminal with an inverter of the low-resistance active path to generate an inverted signal; and enabling a second transistor of the low-resistance active path to be switched to an ON-state in the OFF-state of the pass element in response to the inverted signal to thereby preclude an erroneous switching of the pass element into the ON-state when the pass element is in the OFF-state.

19. The method of claim 18, further comprising:

controlling a turn-on time constant of the pass element during the ON-state of the pass element, and controlling a turn-off time constant of the pass element by enabling the low-resistance active path during the OFF-state of the pass element.

20. The method of claim 19, wherein the first transistor and the pull-up resistor are further configured to enable the ON-state of the pass element when a voltage of the level-shifted signal is above a threshold voltage, and to enable the OFF-state of the pass element when the voltage of the level-shifted signal is below the threshold voltage.

* * * * *